(12) United States Patent
Otsubo et al.

(10) Patent No.: US 10,772,244 B2
(45) Date of Patent: Sep. 8, 2020

(54) HIGH-FREQUENCY MODULE

(71) Applicant: Murata Manufacturing Co., Ltd., Kyoto (JP)

(72) Inventors: Yoshihito Otsubo, Kyoto (JP); Issei Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/809,236

(22) Filed: Nov. 10, 2017

(65) Prior Publication Data

US 2018/0092257 A1 Mar. 29, 2018

Related U.S. Application Data

(63) Continuation of application No. PCT/JP2016/063830, filed on May 10, 2016.

(30) Foreign Application Priority Data

May 11, 2015 (JP) .................................. 2015-096508
Dec. 15, 2015 (JP) .................................. 2015-243853

(51) Int. Cl.
*H05K 9/00* (2006.01)
*H05K 1/02* (2006.01)
(Continued)

(52) U.S. Cl.
CPC ........... *H05K 9/0024* (2013.01); *H01L 23/18* (2013.01); *H01L 23/28* (2013.01);
(Continued)

(58) Field of Classification Search
CPC ...... H05K 9/0024; H05K 5/065; H05K 1/181; H01L 23/552
See application file for complete search history.

(56) References Cited

U.S. PATENT DOCUMENTS 8,897,019 B1 * 11/2014 Shimamura ........... H01L 23/552
361/728
9,055,682 B2 * 6/2015 Mugiya .................... H05K 7/06
(Continued)

FOREIGN PATENT DOCUMENTS

CN 102792789 A 11/2012
CN 104105387 A 10/2014
(Continued)

OTHER PUBLICATIONS

International Search Report for International Application No. PCT/JP2016/063830 dated Jul. 12, 2016.
(Continued)

*Primary Examiner* — Abhishek M Rathod
(74) *Attorney, Agent, or Firm* — Pearne & Gordon LLP

(57) ABSTRACT

The characteristics of a shield wall that prevents the mutual interference of the noise between components are improved by lowering the resistance of the shield wall. A high-frequency module 1a includes a wiring board 2, a plurality of components 3a to 3e mounted on an upper surface 2a of the wiring board 2, a sealing resin layer 4 stacked on the upper surface 2a of the wiring board 2 to seal the components 3a to 3e, and a shield wall 5 disposed between the adjacent components in the sealing resin layer 4. A part of the shield wall 5 is constituted of metal pins 5a standing on the upper surface 2a of the wiring board 2.

17 Claims, 13 Drawing Sheets

(51) Int. Cl.

| | | |
|---|---|---|
| *H01L 23/28* | (2006.01) | |
| *H01L 23/31* | (2006.01) | |
| *H01L 23/66* | (2006.01) | |
| *H01L 23/18* | (2006.01) | |
| *H01L 23/552* | (2006.01) | |
| *H05K 1/18* | (2006.01) | |
| *H05K 5/06* | (2006.01) | |
| *H01L 23/00* | (2006.01) | |
| *H01L 23/538* | (2006.01) | |
| *H05K 3/28* | (2006.01) | |
| *H01L 25/065* | (2006.01) | |

(52) U.S. Cl.
CPC ........ *H01L 23/3135* (2013.01); *H01L 23/552* (2013.01); *H01L 23/66* (2013.01); *H05K 1/0218* (2013.01); *H05K 1/181* (2013.01); *H05K 5/065* (2013.01); *H01L 23/3121* (2013.01); *H01L 23/5383* (2013.01); *H01L 23/5384* (2013.01); *H01L 24/13* (2013.01); *H01L 24/16* (2013.01); *H01L 24/81* (2013.01); *H01L 25/0655* (2013.01); *H01L 2224/13101* (2013.01); *H01L 2224/16225* (2013.01); *H01L 2224/16227* (2013.01); *H01L 2224/81801* (2013.01); *H01L 2924/181* (2013.01); *H01L 2924/19105* (2013.01); *H01L 2924/3025* (2013.01); *H05K 3/284* (2013.01); *H05K 2201/10318* (2013.01); *H05K 2201/10522* (2013.01)

(56) References Cited

U.S. PATENT DOCUMENTS

| | | | | |
|---|---|---|---|---|
| 2006/0258050 | A1* | 11/2006 | Fujiwara | ................ H01L 23/29 438/112 |
| 2007/0246825 | A1* | 10/2007 | Oh | .................... H01L 23/3121 257/728 |
| 2009/0188703 | A1 | 7/2009 | Ito et al. | |
| 2009/0236700 | A1 | 9/2009 | Moriya | |
| 2012/0008288 | A1 | 1/2012 | Tsukamoto et al. | |
| 2012/0320559 | A1 | 12/2012 | Kimura | |
| 2013/0301227 | A1 | 11/2013 | Kawano | |
| 2014/0160699 | A1* | 6/2014 | Zhang | ................... H01L 23/552 361/752 |
| 2014/0293550 | A1 | 10/2014 | Mugiya et al. | |
| 2015/0043189 | A1* | 2/2015 | Kitazaki | ............. H01L 23/3121 361/816 |
| 2015/0049439 | A1* | 2/2015 | Shimamura | .......... H05K 1/0216 361/728 |
| 2015/0171021 | A1* | 6/2015 | Takano | ................... H01L 24/97 257/659 |

FOREIGN PATENT DOCUMENTS

| | | |
|---|---|---|
| JP | H04-58596 A | 2/1992 |
| JP | 2009-277954 A | 11/2009 |
| JP | 2010-056180 A | 3/2010 |
| JP | 2011-151274 | 8/2011 |
| JP | 2011-187677 A | 9/2011 |
| JP | 2012-19091 A | 1/2012 |
| JP | 3185689 U | 8/2013 |
| JP | 2014-203881 A | 10/2014 |
| WO | 2008/093414 A1 | 8/2008 |
| WO | 2009-093343 A1 | 5/2011 |
| WO | 2012-101920 A1 | 6/2014 |

OTHER PUBLICATIONS

Written Opinion of the International Search Report for International Application No. PCT/JP2016/063830 dated Jul. 12, 2016.
Notice of Reason for Rejection for Japanese Patent Application No. 2017-517943 dated May 7, 2019.

* cited by examiner

PRIOR ART

HIGH-FREQUENCY MODULE

This is a continuation of International Application No. PCT/JP2016/063830 filed on May 10, 2016 which claims priority from Japanese Patent Application No. 2015-243853 filed on Dec. 15, 2015 and Japanese Patent Application No. 2015-096508 filed on May 11, 2015. The contents of these applications are incorporated herein by reference in their entireties.

FIELD OF THE DISCLOSURE

The present disclosure relates to a module including a sealing resin layer that covers a component mounted on a wiring board and a shield layer stacked on the sealing resin layer.

DESCRIPTION OF THE RELATED ART

High-frequency modules mounted in, for example, mobile terminal devices sometimes include a shield layer for blocking electromagnetic waves. In some modules of this type, a component mounted on a wiring board is covered with a molding resin and a shield layer is provided to cover a surface of the molding resin.

A shield layer is provided to block external noise. When a plurality of components are mounted on a wiring board, the noise generated from these components interferes with other components. Accordingly, there has hitherto been proposed a module including a shield layer that not only blocks external noise but also mutually blocks the noise between the mounted components. For example, in a high-frequency module 100 described in Patent Document 1, as illustrated in FIG. 26, two components 102 are mounted on a wiring board 101, and both the components 102 are sealed with a molding resin layer 103. In a portion of the molding resin layer 103 between the components, a slit S penetrates the molding resin layer 103. A shield layer 104 covers a surface of the molding resin layer 103, and is made of a conductive resin filled in the slit S. The conductive rein filled in the slit S is electrically coupled to a ground electrode 105 provided in the wiring board 101.

In this case, the components 102 can be shielded from external noise by the conductive resin that covers the surface of the molding resin layer 103. Also, the mutual interference of the noise between the components can be prevented by the conductive resin filled in the slit S.

Patent Document 1: Japanese Unexamined Patent Application Publication No. 2010-225620 (see, for example, paragraphs 0025 to 0026 and FIG. 1)

BRIEF SUMMARY OF THE DISCLOSURE

In recent years, there has been a demand to further improve the characteristics of the shield layer as performance of the high-frequency module increases. To improve the shield characteristics, it is necessary to lower the resistance of the shield layer and to reduce the coupling resistance between the shield layer and the ground electrode. However, since the conductive resin that forms the above-described shield layer 104 is obtained, for example, by adding a metal filler to an epoxy resin, the specific resistance thereof is higher than that of the metal filler alone. Accordingly, for example, it is conceivable to fill the slit S with metal by a film deposition technology such as sputtering. However, if the slit S is deep, it is difficult to deposit a metal onto a bottom portion of the slit S and to lower the resistance of the shield layer.

The present disclosure has been made in view of the above-described problems, and an object of the disclosure is to improve the characteristics of a shield wall for preventing the mutual interference of the noise between components and a shield layer covering a side surface and a front surface of a sealing resin layer by lowering the resistances of the shield wall and the shield layer.

To achieve the above object, a high-frequency module according to the present disclosure includes a wiring board, a plurality of components mounted on a principal surface of the wiring board, a sealing resin layer stacked on the principal surface of the wiring board to seal the plurality of components, and a shield wall disposed between a predetermined component of the plurality of components and the other component inside the sealing resin layer. The shield wall has a metal pin standing on the principal surface of the wiring board.

In this case, since the shield wall disposed between the components has the metal pin having a specific resistance lower than that of a conductive paste, the resistance of the shield wall can be lowered. This can improve the shield characteristics of the shield wall. Further, a problem does not occur in that the shield wall between the components does not reach a bottom portion of a groove provided in the sealing resin layer when the groove is deep as in the case in which the shield wall is formed by the film deposition technology.

The shield wall may be shaped like a line in a plan view of the wiring board, the line may have a bent portion, and the metal pin may be disposed in the bent portion. In the present disclosure, in a plan view, "bent portion" does not always need to be a portion of the shield wall bent 90 degrees. The shield wall may form either an acute angle or an obtuse angle in "bent portion."

The shield wall between the components is sometimes formed by forming a groove in the sealing resin layer by laser beam machining and filling the groove with a conductive paste or filling the groove with metal by plating. When the shield wall has the bent portion in a plan view, the laser irradiation time for the bent portion is longer than the time for other portions. Hence, the total energy of laser light acting on the bent portion is more than in the other portions. In this case, a wiring electrode of the wiring board is damaged by breakage and deformation. Therefore, when the metal pin serving as a part of the shield wall is disposed in the bent portion before the laser groove is formed, the influence of the energy of laser light on the wiring board can be reduced.

One end of the metal pin may be connected to a land electrode provided on the principal surface of the wiring board, and the land electrode may be coupled to a ground electrode provided in the wiring board. In this case, one end of the metal pin and the land electrode can be connected, for example, with solder. In solder connection, the coupling resistance between the shield wall and the ground electrode can be made lower than in the conventional structure in which the shield wall is formed by filling the groove provided in the sealing resin layer with a conductive paste. This can improve the shield characteristics of the shield wall.

The shield wall may have a metal film that fills a groove provided in the sealing resin layer and a side surface of the metal film may be in contact with a side surface of the metal pin. In this case, the shield characteristics of the shield wall can be made better than in the structure in which the shield wall is constituted by only the metal pin.

A purity of metal in the metal film may be lower than a purity of metal in the metal pin. In this case, it is possible to provide a structure in which the purity of metal in a portion of the shield wall other than the metal pin is lower than the purity of metal in the metal pin.

The shield wall may include a first linear portion having a first width and a second linear portion having a second width different from the first width, and a contact point between the first linear portion and the second linear portion may be the bent portion in a plan view of the wiring board. In this case, the energy of laser light acting on the bent portion is also stronger than in the other portion. By disposing the pin in the bent portion, the energy of laser light can be prevented from concentrating at the bent portion.

The sealing resin layer may be disposed between the metal film and the wiring board. In this case, since it is only necessary that a land electrode should be provided only in the portion where the metal pin stands, a wider component mount area can be ensured, compared with a case in which the land electrode is provided all over the portion where the shield wall is provided.

The metal pin of the shield wall may include a plurality of metal pins and the shield wall may be shaped like a line in a plan view of the wiring board, and the plurality of metal pins may be arranged along the line defined by the shield wall in a plan view of the wiring board. According to this structure, since the shield wall has a plurality of metal pins having a low specific resistance, the shield characteristics can be further improved. When the groove is formed in the sealing resin layer by the laser as in the conventional shield wall, the shape of the groove is limited. However, for example, when the shield wall is constituted of only a plurality of metal pins, since it is unnecessary to form the groove for the shield wall, a shield wall having an arbitrary shape can be obtained without such a limitation. Moreover, since the wiring board is not damaged by the laser when the groove is formed, the thickness of the wiring board can be reduced.

The plurality of metal pins may include a plurality of first metal pins and a plurality of second metal pins, a connecting line that connects center points of the plurality of first metal pins may be substantially parallel to the line defined by the shield wall in a plan view of the wiring board, and centers of the plurality of second metal pins may be not aligned with the connecting line and may each be disposed between one of the first metal pins and the first metal pin adjacent thereto in a plan view of the wiring board.

For example, when the shield wall is constituted only of the metal pins, it is necessary that there should be no gap between the adjacent metal pins to improve the shield characteristics between the components. However, it is difficult to arrange the plurality of metal pins in a line without any gap therebetween. According to this structure, for example, when the second metal pins are arranged after the first metal pins are arranged, it is easy to form a shield wall in which there is little gap between adjacent metal pins.

A cross-sectional area of the second metal pins along a direction parallel to the principal surface of the wiring board may be smaller than a cross-sectional area of the first metal pins along the direction parallel to the principal surface of the wiring board. According to this structure, the size of the shield wall can be reduced while improving the shield characteristics by decreasing the gap between the adjacent metal pins.

The line of the shield wall defined in a plan view of the wiring board may have a bent portion or a curved portion. In this case, the degree of flexibility in arranging the components can be increased.

Another high-frequency module according to the present disclosure includes a wiring board, a plurality of components mounted on a principal surface of the wiring board, a sealing resin layer stacked on the principal surface of the wiring board to seal the plurality of components, and a shield layer that covers at least a part of a surface of the sealing resin layer. The shield layer has a plurality of metal pins arranged on a side surface of the sealing resin layer.

According to this structure, since the shield layer for blocking, for example, unnecessary external electromagnetic waves has a plurality of metal pins having a low specific resistance, the shield characteristics can be improved.

Surfaces of the metal pins each have an anticorrosion film. In this case, oxidation of the metal pins can be prevented, and therefore, the characteristics of the shield layer can be prevented from being deteriorated by oxidation of the metal pins.

The plurality of metal pins may be arranged along a peripheral edge of the principal surface of the wiring board to surround the principal surface. In this case, the shield characteristics of the high-frequency module in a direction of the side surface can be improved.

The principal surface of the wiring board may be rectangular, the plurality of metal pins may have respective linear portions in cross sections along a direction parallel to the principal surface of the wiring board, and the linear portions in the plurality of metal pins may be disposed to overlap with a part of a peripheral edge of the principal surface of the wiring board in a plan view of the wiring board. Such a type of high-frequency module is sometimes produced by forming an assembly of a plurality of high-frequency modules arranged in a matrix and then singulating the assembly with a dicing machine into discrete high-frequency modules. In this case, when the metal pins are disposed to cross the boundaries between the adjacent high-frequency modules and cutting the assembly along the boundaries, linear portions are formed in the respective metal pins, and the linear portions overlap with a part of the peripheral edge of the wiring board. Therefore, the structure in which the cross sections of the metal pins have the linear portions and the metal pins are arranged so that the linear portions overlap with a part of the peripheral edge of the principal surface of the wiring board is suitable for the above-described production method for obtaining multiple high-frequency modules.

According to the present disclosure, since the shield wall disposed between the components and a part of the shield layer covering the side surface of the sealing resin layer are constituted of the metal pins having a specific resistance lower than that of the conductive paste, the resistance of the shield can be lowered.

DETAILED DESCRIPTION OF THE DISCLOSURE

First Embodiment

Figure 1:
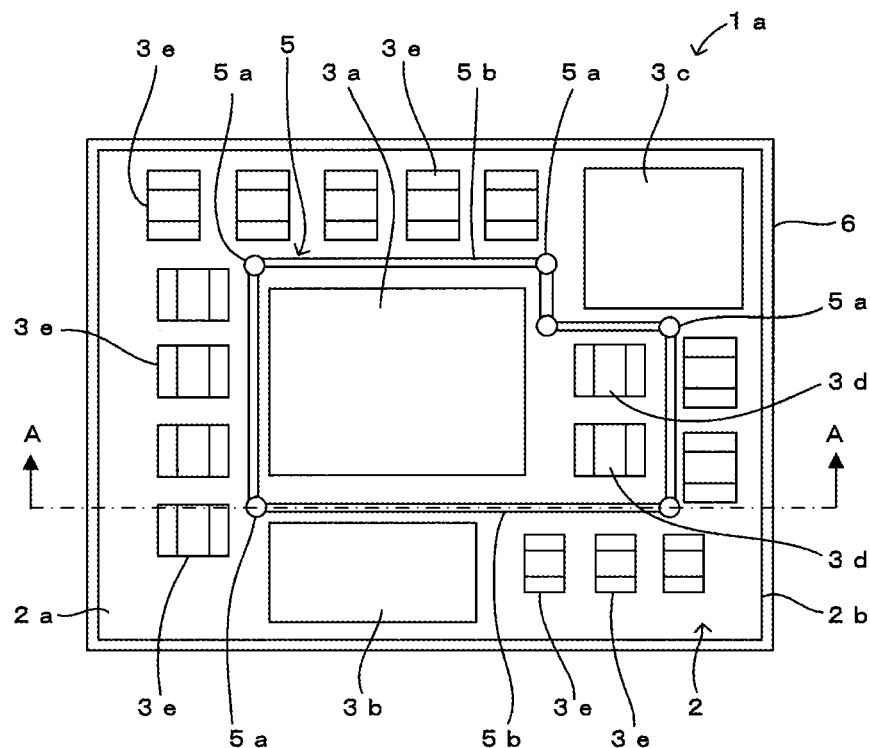
FIG. 1 is a plan view of a high-frequency module according to a first embodiment of the present disclosure.
Figure 2:
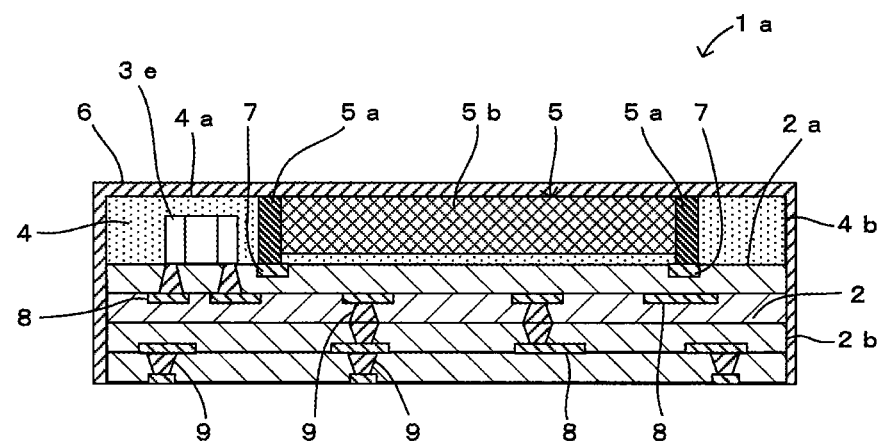
FIG. 2 is a cross-sectional view on arrow A-A in FIG. 1.

A high-frequency module 1a according to a first embodiment of the present disclosure will be described with reference to FIGS. 1 and 2. FIG. 1 is a plan view of the high-frequency module, and FIG. 2 is a cross-sectional view on arrow A-A in FIG. 1. In FIG. 1, a top surface portion of a shield film 6 and a sealing resin layer 4 are not illustrated.

As illustrated in FIGS. 1 and 2, the high-frequency module 1a according to this embodiment includes a wiring board 2, a plurality of components 3a and 3b mounted on an upper surface 2a of the wiring board 2, a sealing resin layer 4 stacked on the upper surface 2a of the wiring board 2, a shield film 6 that covers a surface of the sealing resin layer 4, and a shield wall 5 provided inside the sealing resin layer 4, and is mounted on, for example, a motherboard of an electronic device in which a high-frequency signal is used.

The wiring board 2 is made of, for example, a low-temperature co-fired ceramic material or glass epoxy resin.

The upper surface 2a (corresponding to "principal surface of wiring board" in the present disclosure) has mount electrodes (not illustrated) for mounting the components 3a and 3b and land electrodes 7 for mounting metal pins 5a to be described later. In this embodiment, the wiring board 2 has a multilayer structure, and various wiring electrodes 8 and a plurality of via conductors 9 are provided therein.

The land electrodes 7, the mount electrodes, and the wiring electrodes 8 are each made of a metal that is generally adopted as a wiring electrode, for example, Cu or Al. The via conductors 9 are made of a metal such as Ag or Cu. The land electrodes 7 and the mount electrodes may be plated with Ni/Au.

Components 3a to 3e are constituted by semiconductor elements made of a semiconductor, such as Si or GaAs, and chip components such as a chip inductor, a chip capacitor, and a chip resistor.

The sealing resin layer 4 is stacked on the wiring board 2 to cover the upper surface 2a of the wiring board 2 and the components 3a and 3b. The sealing resin layer 4 can be made of a resin that is generally adopted as sealing resin, for example, epoxy resin.

The shield film 6 shields the wiring electrodes 8 in the wiring board 2 and the components 3a to 3e from external noise, and is stacked on the sealing resin layer 4 to cover an opposite surface 4a of the sealing resin layer 4 opposite from the upper surface 2a of the wiring board 2 and a peripheral side surface 4b of the sealing resin layer 4, and a side surface 2b of the wiring board 2.

The shield film 6 can have a multilayer structure including a close contact film stacked on the surface of the sealing resin layer 4, a conductive film stacked on the close contact film, and a protective film stacked on the conductive film. The shield film 6 is electrically coupled to an unillustrated ground electrode exposed from the side surface 2b of the wiring board 2.

The close contact film is provided to increase the adhesion strength between the conductive film and the sealing resin layer 4, and, for example, can be made of a metal such as SUS. The close contact film may be made of, for example, Ti, Cr, or Ni. The conductive film is a layer having a substantial shield function of the shield film 6, and can be made of, for example, any of metals Cu, Ag, and Al. The protective film is provided to prevent the conductive film from corroding and being scratched, and can be made of, for example, SUS. The protective film may be made of, for example, Ti, Cr, or Ni.

The shield wall 5 is disposed between predetermined components 3a to 3e inside the sealing resin layer 4. A part of the shield wall 5 is constituted of a plurality of metal pins 5a, and the remaining part 5b is constituted by a conductive paste. Specifically, as illustrated in FIG. 1, the shield wall 5 of this embodiment is disposed to surround three components 3a and 3d arranged in a center portion of the upper surface 2a of the wiring board 2, and prevents the mutual interference of the noise between the components 3a and 3d and the other components 3b, 3c, and 3e. Also, an upper end portion of the shield wall 5 is electrically coupled to a top surface of the shield film 6.

The shield wall 5 is shaped like a line in a plan view when viewed from a direction perpendicular to the upper surface 2a of the wiring board 2 (hereinafter referred to as a plan view). The line has a plurality of bent portions, and the metal pins 5a are respectively disposed in the bent portions. Lower end portions of the metal pins 5a are connected (mounted) with solder to the land electrodes 7 provided on the upper surface 2a of the wiring board 2. At least one of the land electrodes 7 is coupled to the unillustrated ground electrode provided inside the wiring board 2.

The remaining part 5b of the shield wall 5 is provided with the resin of the sealing resin layer 4 being interposed between the remaining part 5b and the upper surface 2a of the wiring board 2.

For example, the metal pins 5a are each formed by shearing a wire made of a metal material generally adopted as a wiring electrode, such as Cu, Au, Ag, Al, or a Cu-based alloy. The conductive paste that forms the remaining part 5b of the shield wall 5 is made of, for example, an organic solvent containing a metal filler of any of Cu, Ag, and Al.

(Production Method for High-Frequency Module) Next, a description will be given of a production method for the high-frequency module 1a. First, a wiring board 2 in which various wiring electrodes 8 and via conductors 9 are formed is prepared, and components 3a to 3e are mounted on an upper surface 2a of the wiring board 2 by using a known surface mount technology such as solder mounting. At this time, metal pins 5a are also mounted with solder.

Next, a sealing resin layer 4 is stacked on the upper surface 2a of the wiring board 2 to cover the components 3a to 3e and the metal pins 5a. For example, the sealing resin layer 4 can be formed by coating, printing, transfer molding, or compression molding.

Next, a surface of the sealing resin layer 4 is polished or ground so that upper ends of the metal pins 5a are exposed from an opposite surface 4a of the sealing resin layer 4.

Next, a portion of the sealing resin layer 4 where a shield wall 5 is to be disposed is irradiated with a laser from the opposite surface 4a to form a groove. As illustrated in FIG. 2, the groove is formed with such a depth as not to reach the upper surface 2a of the wiring board 2. The groove may be formed by drilling instead of laser beam machining.

Next, a shield wall 5 is formed by, for example, filling the groove formed in the sealing resin layer 4 with a conductive paste containing a Cu filler by coating or printing.

Next, a shield film 6 is formed by a sputtering device or a vacuum deposition device to cover the surface of the sealing resin layer 4 (opposite surface 4a and peripheral side surface 4b) and a side surface 2b of the wiring board 2, so that a high-frequency module 1a is completed. A portion 5b of the shield wall 5 other than the metal pins 5a may be formed by a film deposition technology similar to that for the shield film 6. In this case, the groove of the sealing resin layer 4 for the shield wall 5 is filled when the shield film 6 is formed.

Therefore, according to the above-described embodiment, since a part of the shield wall 5 disposed between the components 3a to 3e is constituted of the metal pins 5a having a specific resistance lower than that of the conductive paste, the resistance of the shield wall 5 can be lowered. This can improve the shield characteristics of the shield wall 5. Further, a problem does not occur in that the film for the shield wall does not reach a bottom portion of the groove provided in the sealing resin layer 4 when the groove is deep, as in the case in which the shield wall 5 between the components 3a to 3e is formed by the film deposition technology. Moreover, since the wiring conductors to be connected to the shield wall are provided only in the portions where the metal pins stand, a wider component mount area can be ensured than when the wiring conductor is prepared for the entire shield wall.

The shield wall 5 disposed between the components 3a to 3e is sometimes formed by forming a groove in the sealing resin layer 4 by laser beam machining and filling the groove with a conductive paste or filling the groove with metal by plating. When the shield wall 5 has bent portions in a plan view, heat energy of laser light during the formation of the groove more strongly acts on the bent portions than the other portions. In this case, the wiring electrodes 8 in the wiring board 2 are damaged by breakage and deformation. Accordingly, for example, when the metal pins 5a are disposed in the bent portions before the laser groove is formed, damage applied to the wiring electrodes 8 in the wiring board 2 by the heat energy of the laser light can be reduced. When the groove for the shield wall 5 is formed by drilling, similarly, the impact on the wiring board 2 is strong in the bent portions. However, the impact on the wiring board 2 during drilling can be reduced by disposing the metal pins 5a in the bent portions.

By connecting the lower end portions of the metal pins 5a to the land electrodes 7 of the wiring board 2 with solder, the shield wall 5 and the ground electrode in the wiring board 2 are coupled to each other. According to this structure, the coupling resistance between the shield wall 5 and the ground electrode of the wiring board 2 can be made lower than in the conventional structure in which the groove of the sealing resin layer is filled with the conductive paste to form the shield wall. Hence, the shield characteristics of the shield wall 5 can be improved. Moreover, the coupling reliability between the shield wall 5 and the wiring board 2 can be made higher than before by connecting the metal pins 5a and the land electrodes 7 with solder.

(Modification of Shield Wall 5)

Figure 3:
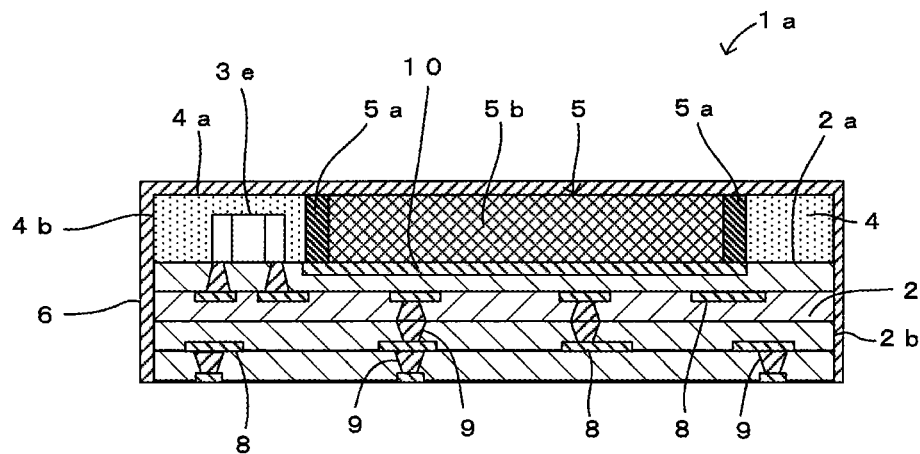
FIG. 3 illustrates a modification of a shield wall in FIG. 1.

For example, the groove of the sealing resin layer 4 for the shield wall 5 may be formed to reach the upper surface 2a of the wiring board 2, as illustrated in FIG. 3. In this case, a shield electrode 10 is formed over almost the entire region of the upper surface 2a of the wiring board 2 overlapping with the shield wall 5 in a plan view, and the metal pins 5a are mounted on the shield electrode 10. According to this structure, damage to the wiring board 2 due to heat energy of laser light in formation of the groove for the shield wall 5 by laser beam machining can be reduced by the reflection effect of the shield electrode 10 for the laser light.

Second Embodiment

Figure 4:
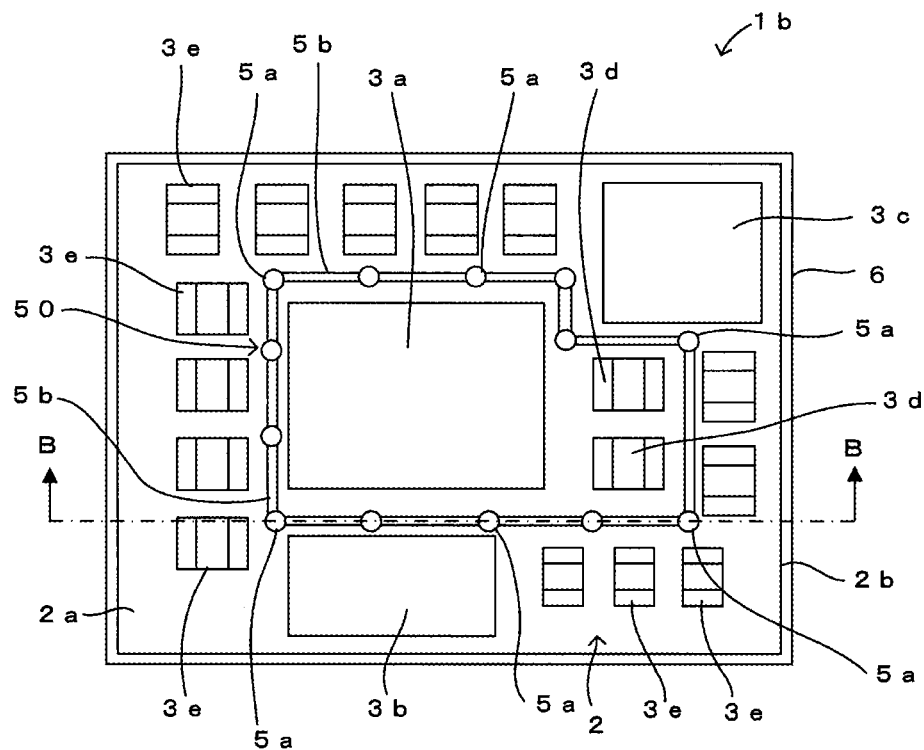
FIG. 4 is a plan view of a high-frequency module according to a second embodiment of the present disclosure.
Figure 5:
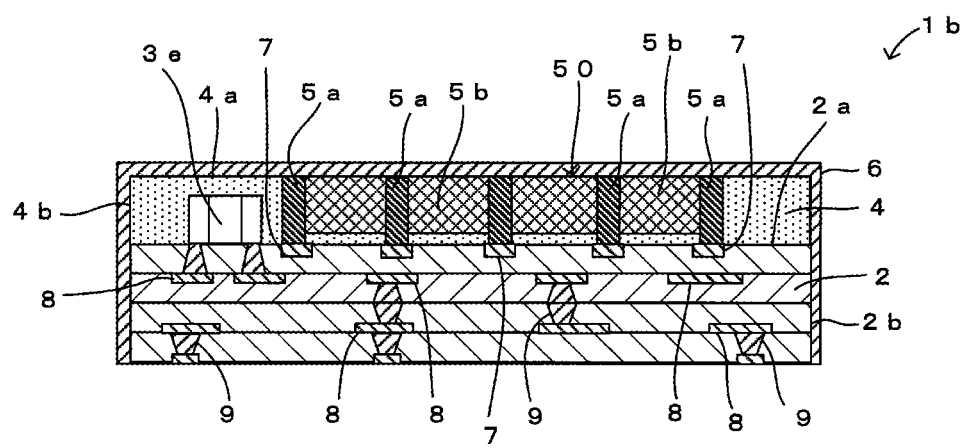
FIG. 5 is a cross-sectional view on arrow B-B in FIG. 4.

A high-frequency module 1b according to a second embodiment of the present disclosure will be described with reference to FIGS. 4 and 5. FIG. 4 is a plan view of the high-frequency module 1b, and FIG. 5 is a cross-sectional view on arrow B-B in FIG. 4. In FIG. 4, a top surface portion of a shield film 6 and a sealing resin layer 4 are not illustrated.

The high-frequency module 1b of this embodiment is different from the high-frequency module 1a of the first embodiment described with reference to FIGS. 1 and 2 in the structure of a shield wall 50, as illustrated in FIGS. 4 and 5. Since other structures are the same as those of the high-frequency module 1a of the first embodiment, they are denoted by the same reference numerals, and descriptions thereof are thereby skipped.

In this case, in a plan view, a plurality of metal pins 5a are also disposed in portions other than bent portions of the shield wall 50. Further, land electrodes 7 are provided at respective mount portions of the metal pins 5a on an upper surface 2a of a wiring board 2.

According to this structure, the resistance of the entire shield wall 50 can be lowered by increasing the number of metal pins 5a having a specific resistance lower than that of a conductive paste. Hence, the shield characteristics of the shield wall 50 between components 3a to 3e can be further improved. Moreover, the coupling resistance between the shield wall 50 and a ground electrode in the wiring board 2 can be further lowered.

(Modification of Shield Wall 50)

Figure 6:
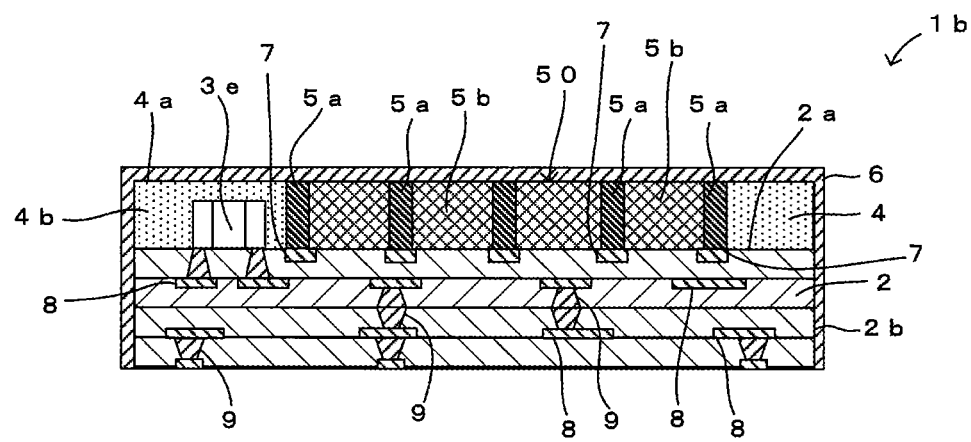
FIG. 6 illustrates a modification of a shield wall in FIG. 4.

For example, a groove provided in the sealing resin layer 4 for the shield wall 50 may be formed to reach the upper surface 2a of the wiring board 2, as illustrated in FIG. 6. Further, similarly to the modification of the shield wall 5 illustrated in FIG. 3, a shield electrode may be formed over almost the entire region of the upper surface 2a of the wiring board 2 overlapping with the shield wall 50 in a plan view, and metal pins 5a may be mounted on the shield electrode. Although not illustrated, a wiring electrode different from wiring electrodes where the metal pins stand may be provided under the groove for the shield wall.

Third Embodiment

Figure 7:
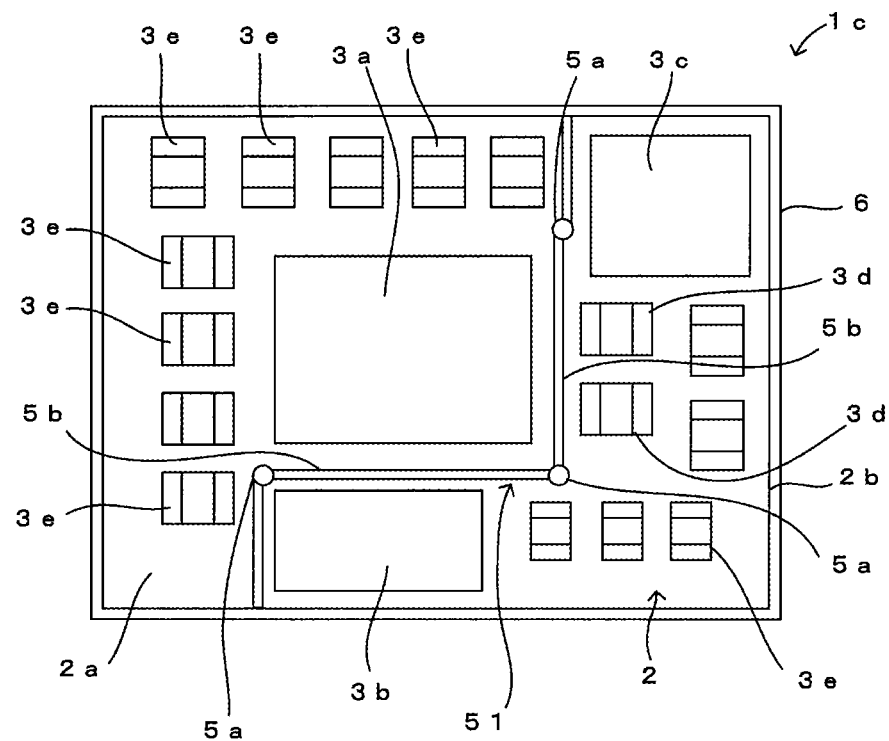
FIG. 7 is a plan view of a high-frequency module according to a third embodiment of the present disclosure.

A high-frequency mode 1c according to a third embodiment of the present disclosure will be described with reference to FIG. 7. FIG. 7 is a plan view of the high-frequency module 1c, and corresponds to FIG. 1.

The high-frequency module 1c of this embodiment is different from the high-frequency module 1a of the first embodiment described with reference to FIGS. 1 and 2 in the structure of a shield wall 51, as illustrated in FIG. 7. Since other structures are the same as those of the high-frequency module 1a of the first embodiment, they are denoted by the same signs and descriptions thereof are thereby skipped.

While the above-described shield wall 5 of the first embodiment is disposed to surround the components 3a and 3d located in the center portion of the upper surface 2a of the wiring board 2, the shield wall 51 of this embodiment is disposed to divide the upper surface 2a of the wiring board 2 into two regions. In this way, the arrangement of the shield wall 51 may be appropriately changed according to the arrangement of the components 3a to 3e to be prevented from mutual interference.

Fourth Embodiment

Figure 8:
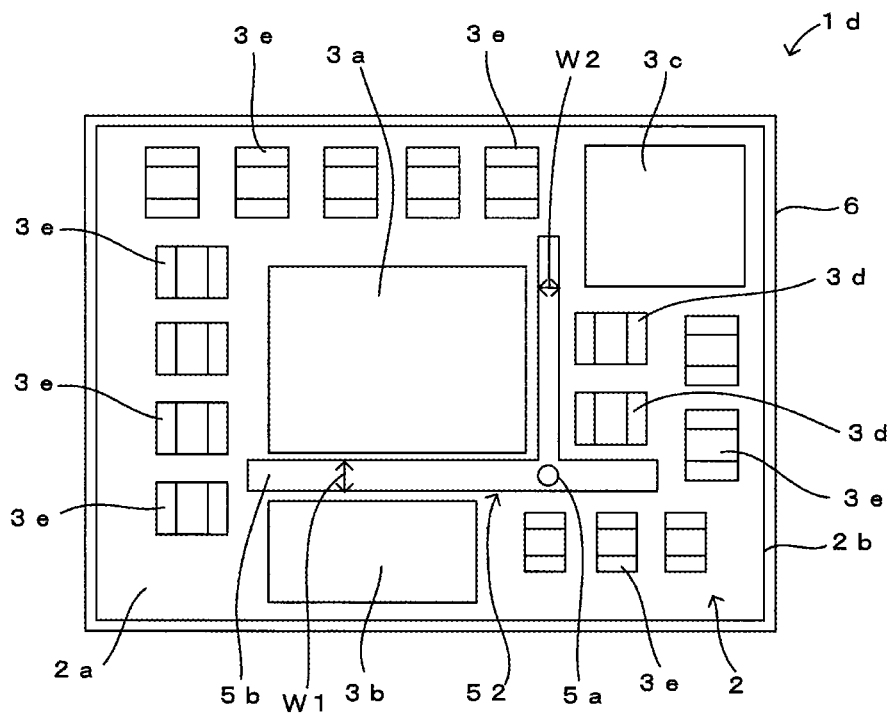
FIG. 8 is a plan view of a high-frequency module according to a fourth embodiment of the present disclosure.

A high-frequency module 1d according to a fourth embodiment of the present disclosure will be described with reference to FIG. 8. FIG. 8 is a plan view of the high-frequency module 1d, and corresponds to FIG. 1.

The high-frequency module 1d of this embodiment is different from the high-frequency module 1a of the first embodiment described with reference to FIGS. 1 and 2 in the structure of a shield wall 52, as illustrated in FIG. 8. Since other structures are the same as those of the high-frequency module 1a of the first embodiment, they are denoted by the same signs, and descriptions thereof are thereby skipped.

In this case, the shield wall 52 is disposed only between components to be prevented from mutual interference. Specifically, as illustrated in FIG. 8, the shield wall 52 has a planar shape formed by a combination of a portion (corresponding to "first linear portion" in the present disclosure) which is shaped like a horizontally long rectangle in a plan view and is disposed between a center component 3a and a component 3b adjacent thereto on an upper surface 2a of a wiring board 2 and a portion (corresponding to "second linear portion" in the present disclosure) which is shaped like a vertically long rectangle in a plan view and is disposed between the component 3a and components 3d and 3c adjacent thereto to extend in a direction perpendicular to the horizontally long rectangular portion. A metal pin 5a is disposed in a connecting portion between these portions. A width W1 (corresponding to "first width" in the present disclosure) in a plan view of the horizontally long rectangular portion of the shield wall 52 is larger than a width W2 (corresponding to "second width" in the present disclosure) of the vertically long rectangular portion. In the present disclosure, a connecting portion where an end portion of one rectangular portion is in contact with a long side of the other rectangular portion in a plan view of the wiring board, as in the connecting portion between the horizontally long rectangular portion and the vertically long rectangular portion in FIG. 8, is also referred to as "bent portion." Although not illustrated, an intersection point where the two rectangular portions intersect in a plan view of the wiring board 2 is also referred to as "bent portion."

By thus disposing the shield wall 52 only between the components that particularly need to be prevented from mutual interference, the degree of flexibility in designing the upper surface 2a of the wiring board 2 can be increased. Further, the shield characteristics of the horizontally long rectangular portion can be made better than that of the vertically long rectangular portion by setting the width W1 of the horizontally long rectangular portion to be larger than the width W2 of the vertically long rectangular portion. That is, to prevent the mutual interference between the components, the width of the shield wall 52 can be appropriately changed according to the required shield characteristics. This can efficiently prevent the mutual interference of the noise between the components while ensuring the component mount region.

Fifth Embodiment

Figure 9:
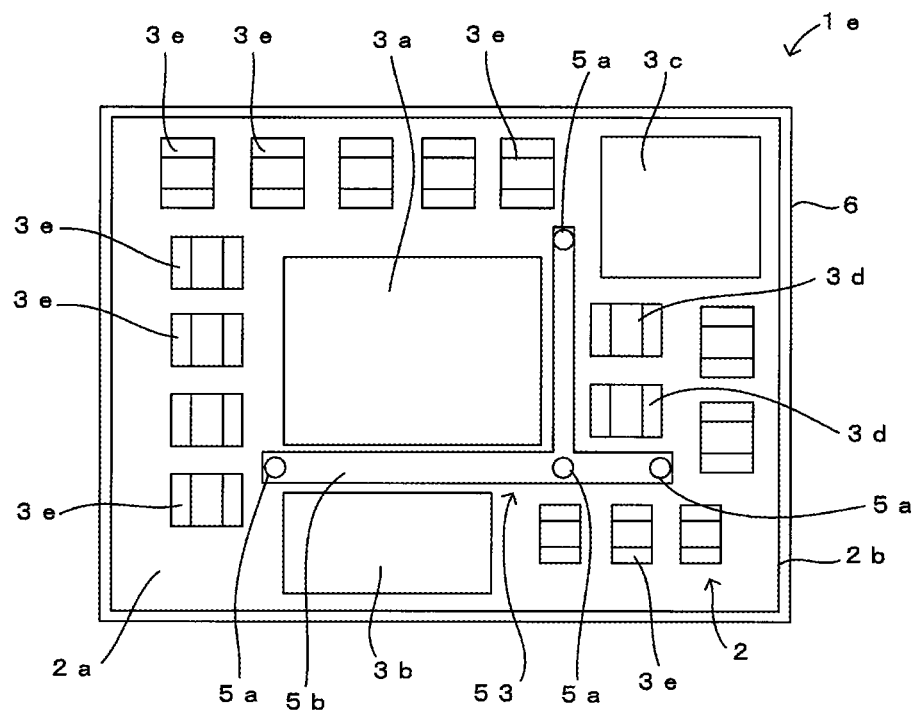
FIG. 9 is a plan view of a high-frequency module according to a fifth embodiment of the present disclosure.

A high-frequency module 1e according to a fifth embodiment of the present disclosure will be described with reference to FIG. 9. FIG. 9 is a plan view of the high-frequency module 1e, and corresponds to FIG. 1.

The high-frequency module 1e of this embodiment is different from the high-frequency module 1d of the fourth embodiment described with reference to FIG. 8 in the structure of a shield wall 53, as illustrated in FIG. 9. Since other structures are the same as those of the high-frequency module 1d of the fourth embodiment, they are denoted by the same signs, and descriptions thereof are thereby skipped.

In this case, as illustrated in FIG. 9, metal pins 5a are disposed in a connecting portion between a horizontally long rectangular portion and a vertically long rectangular portion and in end portions of both the rectangular portions.

According to this structure, the number of metal pins 5a that constitute the shield wall 53 is larger than that of the shield wall 52 of the fourth embodiment. Hence, the resistance of the entire shield wall 53 and the coupling resistance to a ground electrode of a wiring board 2 can be made lower than in the shield wall 52 of the fourth embodiment.

Sixth Embodiment

Figure 10:
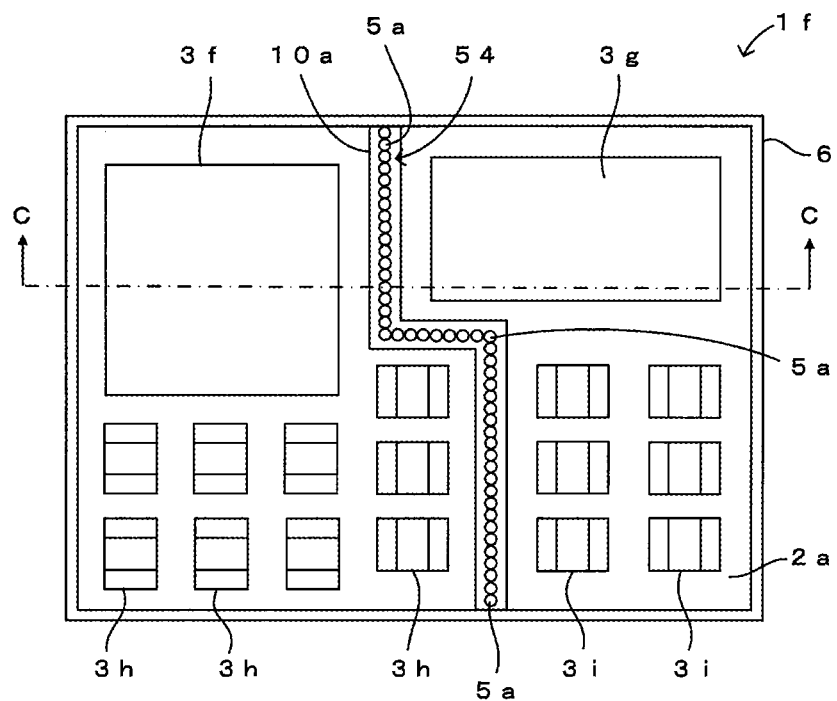
FIG. 10 is a plan view of a high-frequency module according to a sixth embodiment of the present disclosure.
Figure 11:
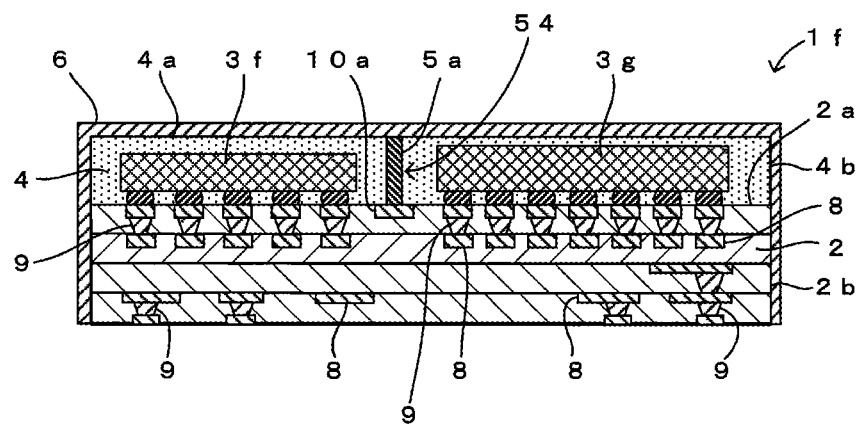
FIG. 11 is a cross-sectional view on arrow C-C in FIG. 10.

A high-frequency module if according to a sixth embodiment of the present disclosure will be described with reference to FIGS. 10 and 11. FIG. 10 is a plan view of the high-frequency module if and corresponds to FIG. 1, and FIG. 11 is a cross-sectional view on arrow C-C in FIG. 10.

The high-frequency module if of this embodiment is different from the high-frequency module 1a of the first embodiment described with reference to FIGS. 1 and 2 in the structure of a shield wall 54, the shape of an electrode on which metal pins 5a are mounted, and the arrangement structure of components 3f to 3i, as illustrated in FIGS. 10 and 11. Since other structures are the same as those of the high-frequency module 1a of the first embodiment, they are denoted by the same signs, and descriptions thereof are thereby skipped.

In this case, the shield wall 54 is constituted of a plurality of metal pins 5a, and is disposed to divide an upper surface 2a of a wiring board 2 into two regions. At this time, as illustrated in FIG. 10, the metal pins 5a are arranged in a line with little gap therebetween, and are arranged in the form of a polygonal line in a plan view of the wiring board 2. For this reason, the shield wall 54 has bent portions in a plan view of the wiring board 2. Further, on the upper surface 2a of the wiring board 2, a shield electrode 10a similar to the shield electrode 10 of FIG. 3 is provided instead of the land electrodes 7 for mounting the metal pins 5a. This shield electrode 10a is shaped like a polygonal line having a predetermined width along the arrangement direction of the metal pins 5a.

The components 3f to 3i are constituted by semiconductor elements made of a semiconductor, such as Si or GaAs, and chip components such as a chip inductor, a chip capacitor, and a chip resistor, similarly to the components 3a to 3e illustrated in FIG. 1 and other figures.

According to this structure, since the shield wall 54 is constituted of a plurality of metal pins 5a having a low specific resistance, the shield characteristics can be further improved. When a groove for the shield wall is formed in a sealing resin layer by a laser as in the conventional shield wall for preventing the mutual interference of the noise between the components, the shape of the groove is limited. However, when the shield wall is constituted only of a plurality of metal pins 5a, since it is unnecessary to form a groove for the shield wall, a shield wall 54 having an arbitrary shape can be obtained without such a limitation. Further, since the degree of flexibility in the shape of the shield wall 54 is increased, the degree of flexibility in arranging the components 3f to 3i can be increased.

In the structure in which the groove for the shield wall is filled with a conductive paste, a groove width exceeding about 600 μm is sometimes needed from the viewpoint of the filling property of the conductive paste in the groove. However, the diameter of the metal pins 5a can be at least about 100 and does not need to reach 600 When the groove for the shield wall is formed by using the laser to such a depth as to penetrate the sealing resin layer 4, the width of the shield electrode 10 (see FIG. 3) is preferably wide to reduce damage to the wiring board 2. However, it is only required that the metal pins 5a should have a width required for mounting, and this can make the width smaller than when the groove is formed. Although the components need to be located at a certain distance from the groove for the shield wall to avoid the influence of laser light on the components 3f to 3i, this distance is not needed in the case of the shield wall 54 that does not use the laser. Therefore, the components 3f to 3i can be easily disposed near the shield wall 54, and this can reduce the size of the high-frequency module 1f. Further, since the damage of the laser to the wiring board 2 during the formation of the groove is not caused, the thickness of the wiring board 2 can be reduced.

Seventh Embodiment

Figure 12:
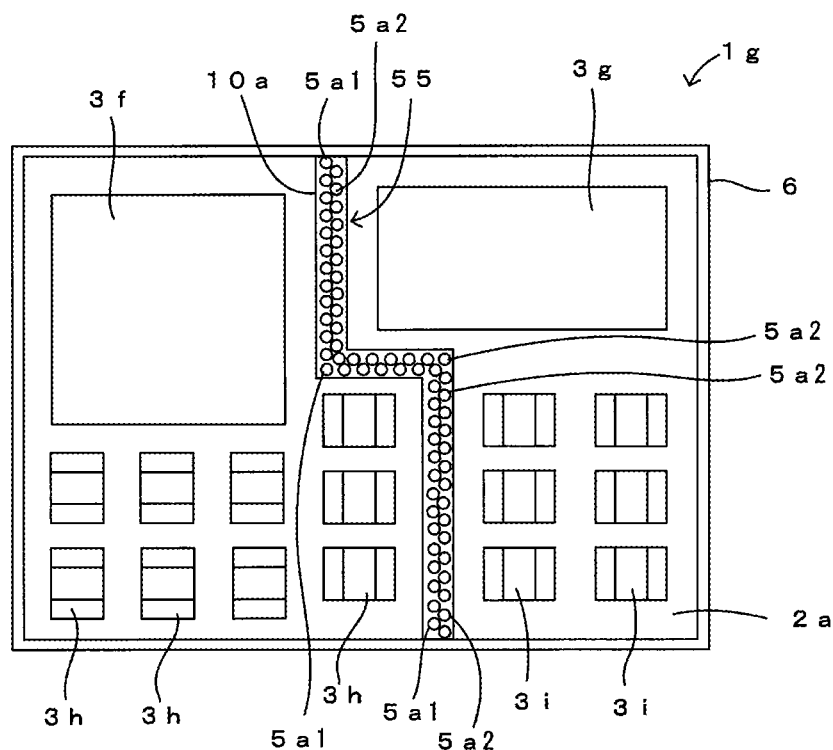
FIG. 12 is a plan view of a high-frequency module according to a seventh embodiment of the present disclosure.
Figure 13:
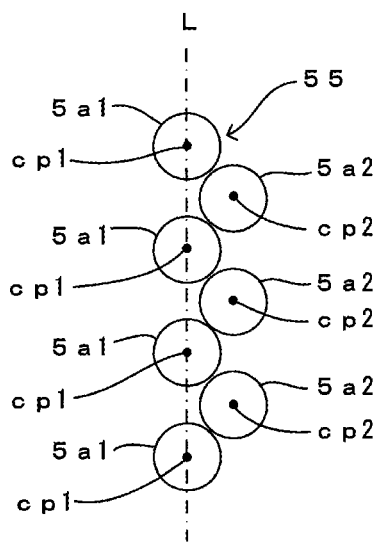
FIG. 13 explains the arrangement of metal pins in FIG. 12.

A high-frequency module 1g according to a seventh embodiment of the present disclosure will be described with reference to FIGS. 12 and 13. FIG. 12 is a plan view of the high-frequency module 1g and corresponds to FIG. 1, and FIG. 13 explains the arrangement of metal pins 5a1 and 5a2 in FIG. 12. In FIG. 13, some of the metal pins 5a1 and 5a2 in a plan view of a wiring board 2 are illustrated.

The high-frequency module 1g according to this embodiment is different from the high-frequency module if of the sixth embodiment described with reference to FIGS. 10 and 11 in the arrangement of the metal pins 5a1 and 5a2 that constitute a shield wall 55, as illustrated in FIG. 12. Since other structures are the same as those of the high-frequency module if of the sixth embodiment, they are denoted by the same signs and descriptions thereof are thereby skipped.

In this case, the shield wall 55 is constituted of a plurality of first metal pins 5a1 and a plurality of second metal pins 5a2. At this time, as illustrated in FIG. 13, in a plan view of the wiring board 2, the first metal pins 5a1 are arranged in a line at a predetermined interval so that a connecting line L connecting center points cp1's of the first metal pins 5a1 is substantially parallel to a line defined by the shield wall 55. On the other hand, the second metal pins 5a2 are arranged close to the first metal pins 5a1 so that center points cp2's of the second metal pins 5a2 are not aligned with the connecting line L and are each located between one first metal pin 5a1 and the adjacent first metal pin 5a1. In other words, for example, when the shield wall 55 is viewed from a direction perpendicular to the connecting line L in FIG. 13, gaps are formed between the adjacent first metal pins 5a1, but the second metal pins 5a2 are disposed to close these gaps. When the metal pins 5a1 and 5a2 are mounted, the first metal pins 5a1 are first mounted at a predetermined interval, and the second metal pins 5a2 are then mounted to close the gaps between the first metal pins 5a1.

According to this structure, since the shield wall 55 with little gap between the adjacent metal pins 5a1 and 5a2 is easily formed, the shield characteristics can be further improved.

Figure 14:
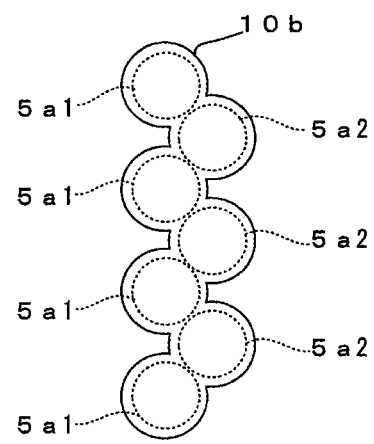
FIG. 14 illustrates a modification of a shield electrode in FIG. 12.

While the second metal pins 5a2 are disposed close to the first metal pins 5a1 on the right side of the connecting line L in FIG. 13 in the above-described embodiment, some or all of the second metal pins 5a2 may be disposed close to the first metal pins 5a2 on the left side of the connecting line L. The shape of a shield electrode 10a can be appropriately changed. For example, as illustrated in FIG. 14, a shield electrode 10b may be formed in such a shape that land electrodes arranged at mount positions of the metal pins 5a1 and 5a2 on an upper surface 2a of a wiring board 2 and being one size larger than the cross sections of the metal pins 5a1 and 5a2 (the cross sections along a direction parallel to the upper surface 2a of the wiring board 2: transverse sections) are connected and combined. In this case, the metal pins 5a1 and 5a2 can be easily disposed at desired positions when mounted with solder by utilizing the self-alignment effect.

Figure 15:
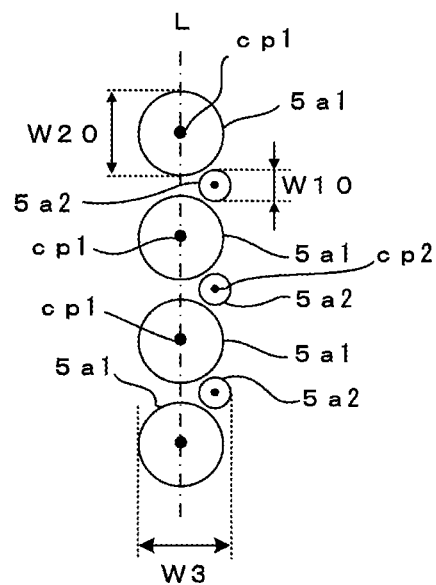
FIG. 15 illustrates a modification of the metal pins in FIG. 12.
Figure 16:
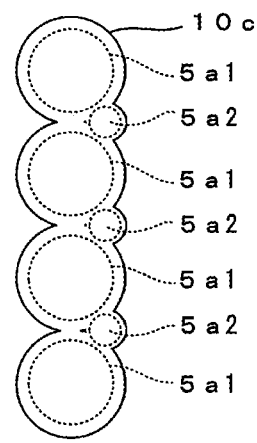
FIG. 16 illustrates land electrodes on which the metal pins in FIG. 15 are to be mounted.

As illustrated in FIG. 15, a diameter W10 of the second metal pins 5a2 may be smaller than a diameter W20 of the first metal pins 5a1. This can make a width W3 of the shield wall 55 small while reducing the gaps between the adjacent metal pins 5a1 and 5a2 and improving the shield characteristics. Alternatively, even in this structure, the shape of a shield electrode 10c may be similar to that of the shield electrode 10b of FIG. 14, as illustrated in FIG. 16.

Eighth Embodiment

Figure 17:
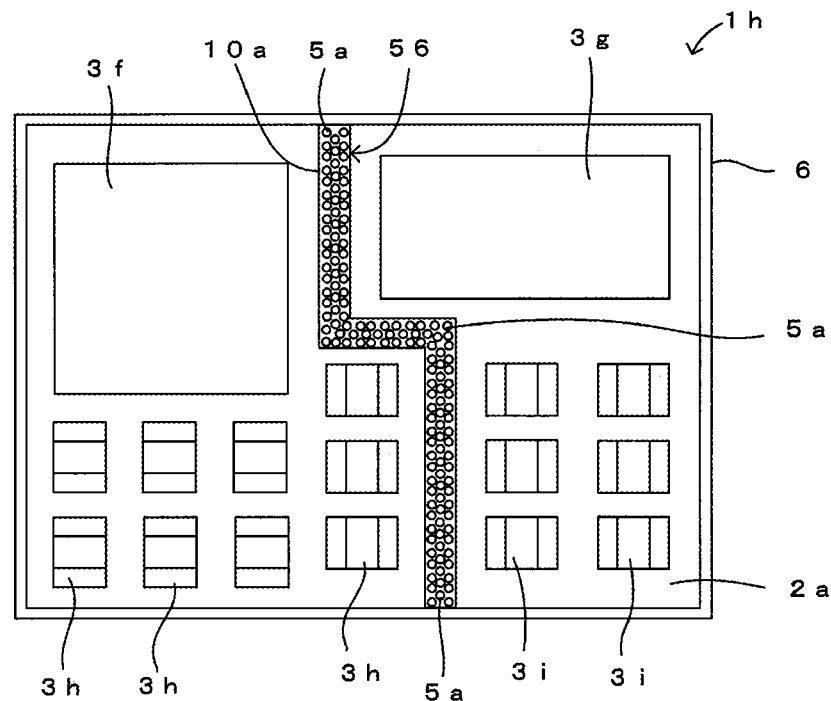
FIG. 17 is a plan view of a high-frequency module according to an eighth embodiment of the present disclosure.

A high-frequency module 1h according to an eighth embodiment of the present disclosure will be described with reference to FIG. 17. FIG. 17 is a plan view of the high-frequency module 1h, and corresponds to FIG. 1.

The high-frequency module 1h of this embodiment is different from the high-frequency module if of the sixth embodiment described with reference to FIGS. 10 and 11 in the number of metal pins 5a that constitute a shield wall 56, as illustrated in FIG. 17. Since other structures are the same as those of the high-frequency module if of the sixth embodiment, they are denoted by the same signs and descriptions thereof are thereby skipped.

In this case, as illustrated in FIG. 17, in a plan view of a wiring board 2, a plurality of metal pins 5a are mounted in the width direction of the shield wall 56 almost all over a shield electrode 10a. This can improve the shield characteristics of the shield wall 56.

Ninth Embodiment

Figure 18:
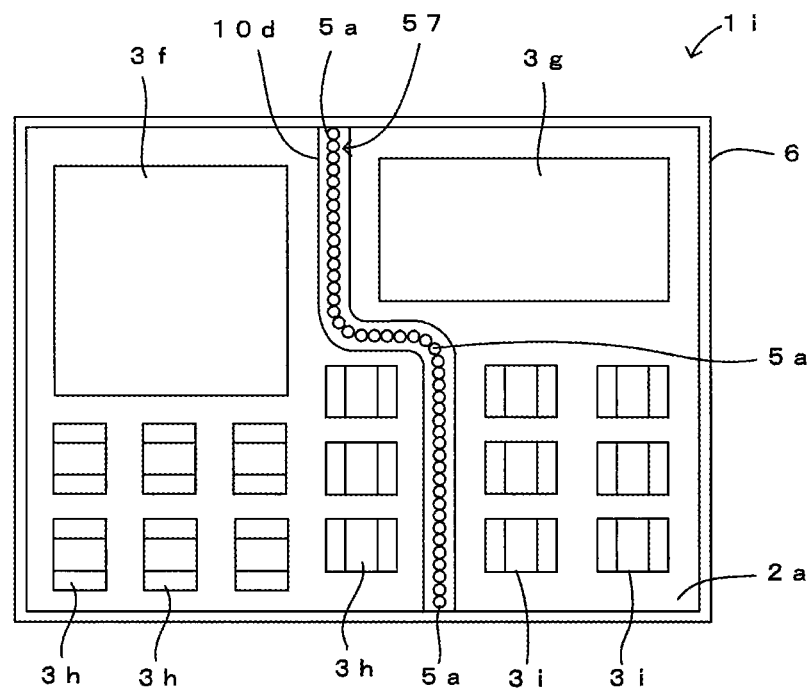
FIG. 18 is a plan view of a high-frequency module according to a ninth embodiment of the present disclosure.

A high-frequency module 1i according to a ninth embodiment of the present disclosure will be described with reference to FIG. 18. FIG. 18 is a plan view of the high-frequency module 1i, and corresponds to FIG. 1.

The high-frequency module 1i of this embodiment is different from the high-frequency module if of the sixth embodiment described with reference to FIGS. 10 and 11 in the structure of a shield wall 57 and the shape of a shield electrode 10d, as illustrated in FIG. 18. Since other structures are the same as those of the high-frequency module if of the sixth embodiment, they are denoted by the same signs, and descriptions thereof are thereby skipped.

In this case, metal pins 5a are arranged so that the shield wall 57 has curved portions in a plan view of a wiring board 2. The shield electrode 10d is shaped like a line having curved portions in accordance with the arrangement direction of the metal pins 5a.

According to this structure, the degree of flexibility in arranging components 3f to 3i to be mounted on the wiring board 2 can be increased.

Tenth Embodiment

Figure 19:
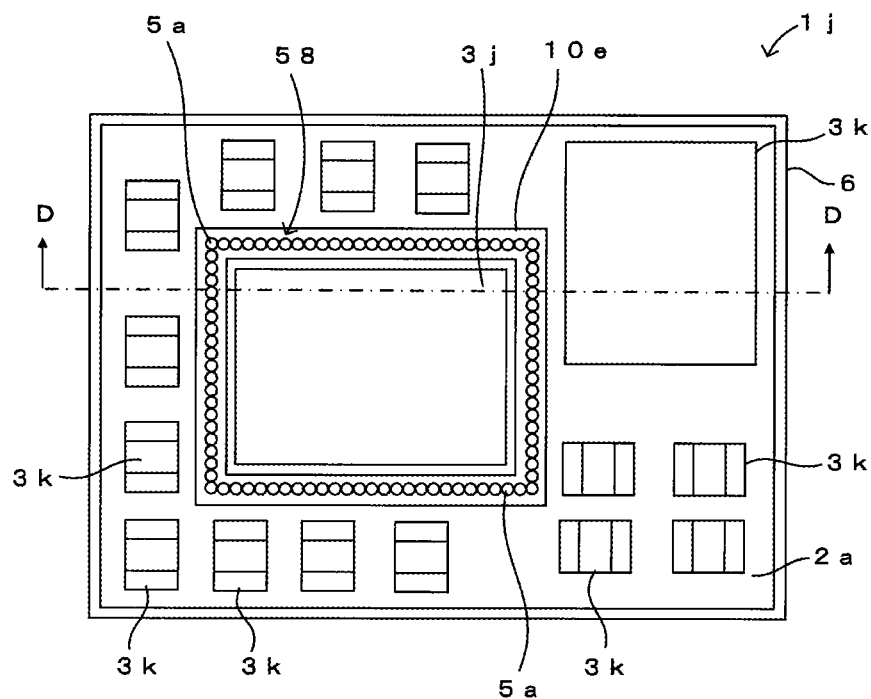
FIG. 19 is a plan view of a high-frequency module according to a tenth embodiment of the present disclosure.
Figure 20:
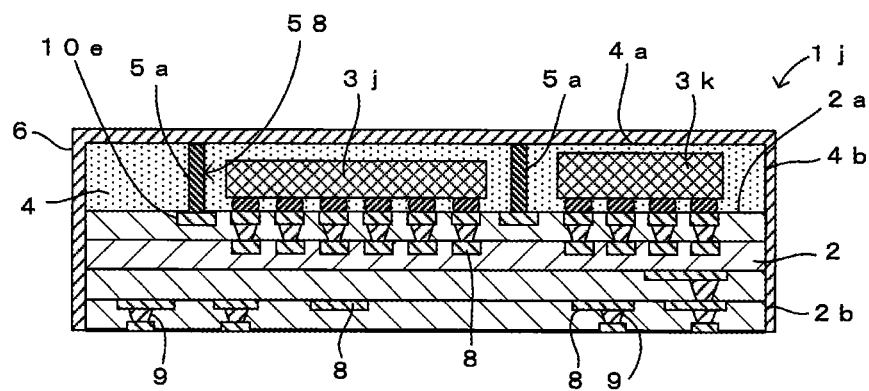
FIG. 20 is a cross-sectional view on arrow D-D in FIG. 19.

A high-frequency module 1j according to a tenth embodiment of the present disclosure will be described with reference to FIGS. 19 and 20. FIG. 19 is a plan view of the high-frequency module 1j and corresponds to FIG. 1, and FIG. 20 is a cross-sectional view on arrow D-D in FIG. 19.

The high-frequency module 1j of this embodiment is different from the high-frequency module if of the sixth embodiment described with reference to FIGS. 10 and 11 in the structure of a shield wall 58, the shape of a shield electrode 10e, and the arrangement structure of components, as illustrated in FIG. 19. Since other structures are the same as those of the high-frequency module if of the sixth embodiment, they are denoted by the same signs, and descriptions thereof are thereby skipped.

In this case, the shield wall 58 is provided to surround one component 3j mounted near the center of an upper surface 2a of a wiring board 2. The shield wall 58 is constituted of a plurality of metal pins 5a, and the metal pins 5a are arranged to surround the component 3j. At this time, the metal pins 5a are arranged with little gap between the adjacent metal pins 5a. The shield electrode 10e has such an annular shape as to surround the component 3j in accordance with the arrangement of the metal pins 5a.

According to this structure, when the shield wall 58 surrounds the predetermined region, effects similar to those of the high-frequency module if of the sixth embodiment can be obtained.

(Modification of Shield Film)

Figure 21:
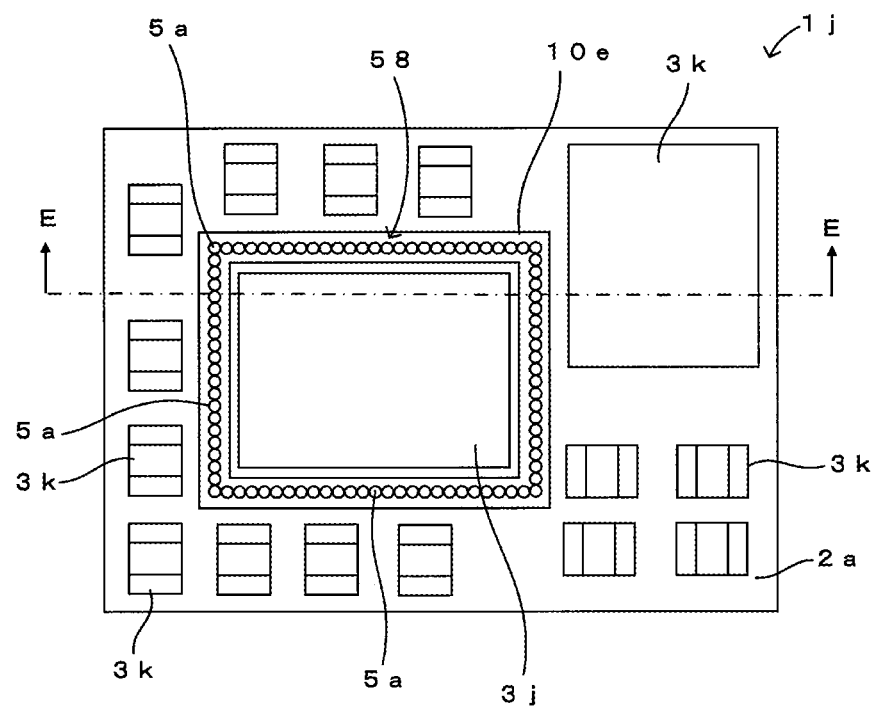
FIG. 21 illustrates a modification of a shield film in FIG. 19.
Figure 22:
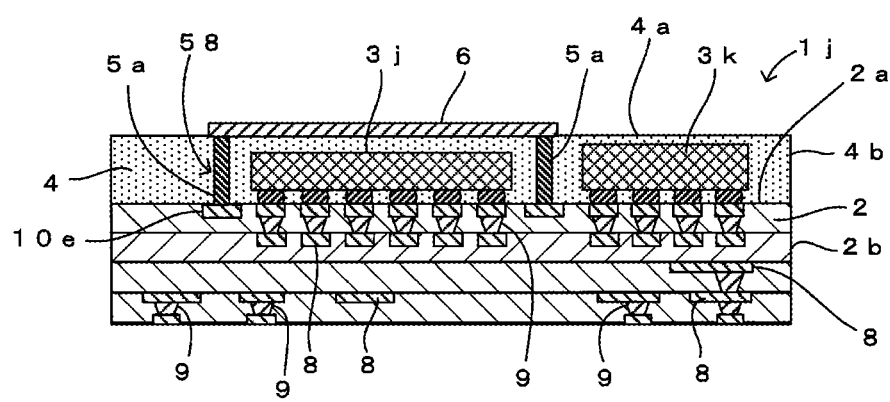
FIG. 22 is a cross-sectional view on arrow E-E in FIG. 21.

In the high-frequency module 1j, the region covered with a shield film 6 can be appropriately changed. For example, as illustrated in FIGS. 21 and 22, the shield film 6 may be provided to cover only a region on an opposite surface 4a of a sealing resin layer 4 where the shield wall 58 surrounds the predetermined component 3j. In this case, upper end faces of the metal pins 5a are connected to a peripheral end portion of the shield film 6. This structure is suitable for shielding only the specific component 3j. Here, FIG. 21 illustrates a modification of the shield film of FIG. 19 and corresponds to FIG. 1, and FIG. 22 is a cross-sectional view on arrow E-E in FIG. 21. When only the specific component 3j is thus shielded, the sealing resin layer 4 may be provided only for the specific component 3j.

Eleventh Embodiment

Figure 23:
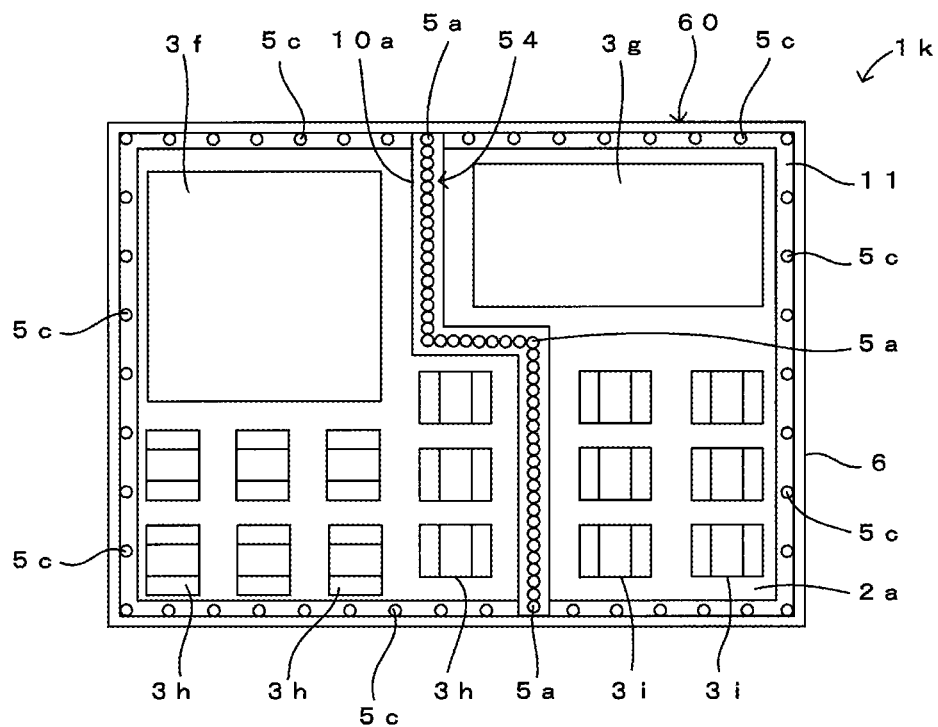
FIG. 23 is a plan view of a high-frequency module according to an eleventh embodiment of the present disclosure.

A high-frequency module 1k according to an eleventh embodiment of the present disclosure will be described with reference to FIG. 23. FIG. 23 is a plan view of the high-frequency module 1k and corresponds to FIG. 1.

The high-frequency module 1k of this embodiment is different from the high-frequency module if of the sixth embodiment described with reference to FIGS. 10 and 11 in including a shield layer 60 composed of a shield film 6 and a plurality of shield-layer metal pins 5c, as illustrated in FIG. 23. Since other structures are the same as those of the high-frequency module if of the sixth embodiment, they are denoted by the same signs, and descriptions thereof are thereby skipped.

In this case, a plurality of shield-layer metal pins 5c are arranged at a predetermined interval in a peripheral edge portion of an upper surface 2a of a wiring board 2. The shield-layer metal pins 5c are also arranged along the peripheral edge portion of the upper surface 2a of the wiring board 2 to surround the upper surface 2a. In the peripheral edge portion of the upper surface 2a of the wiring board 2, a shield-layer metal-pin mount electrode 11 for mounting the shield-layer metal pins 5c is provided. The shield-layer metal pins 5c and the shield film are electrically coupled.

As described above, when the shield film 6 is formed by, for example, sputtering, the film thickness of a peripheral side surface 4b of the sealing resin layer 4 is smaller than that of the opposite surface 4a of the sealing resin layer 4. Hence, the shield characteristics at the peripheral side surface 4b are worse than at the opposite surface 4a. Accordingly, the shield characteristics of the peripheral side surface 4b can be improved by forming a part of the shield layer 60 by a plurality of shield-layer metal pins 5c mounted in the peripheral edge portion of the upper surface 2a of the wiring board 2. Hereinafter, a portion of the shield layer 60 that covers the peripheral side surface 4b of the sealing resin layer 4 is sometimes referred to as a side surface shield, and a portion of the shield layer 60 that covers the opposite surface 4a of the sealing resin layer 4 is sometimes referred to as a top surface shield.

Twelfth Embodiment

Figure 24:
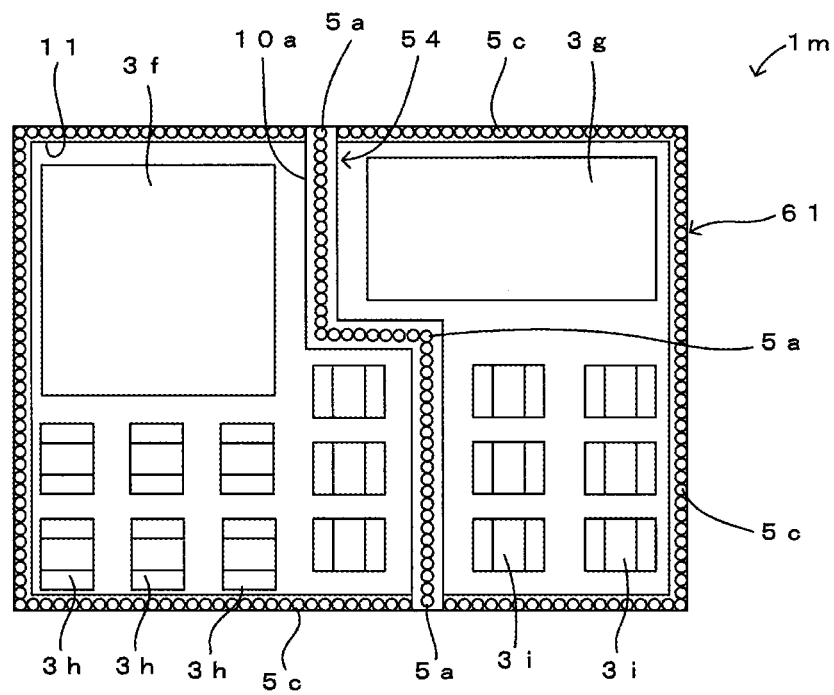
FIG. 24 is a plan view of a high-frequency module according to a twelfth embodiment of the present disclosure.

A high-frequency module 1m according to a twelfth embodiment of the present disclosure will be described with reference to FIG. 24. FIG. 24 is a plan view of the high-frequency module 1m and corresponds to FIG. 1.

The high-frequency module 1m of this embodiment is different from the high-frequency module 1k of the eleventh embodiment described with reference to FIG. 23 in the structure of a shield layer 61, as illustrated in FIG. 24. Since other structures are the same as those of the high-frequency module 1f of the sixth embodiment, they are denoted by the same signs and descriptions thereof are thereby skipped.

In this case, the shield layer 61 is composed of a plurality of shield-layer metal pins 5c and a shield film 6 that covers an opposite surface 4a of a sealing resin layer 4 and upper end faces of the shield-layer metal pins 5c. At this time, the shield-layer metal pins 5c are arranged in a line along a peripheral edge of an upper surface 2a of a wiring board 2 while having little gap between the shield-layer metal pins 5c and other adjacent pins 5c. A side surface shield of the shield layer 61 is composed of only the shield-layer metal pins 5c, and the shield film 6 covers the opposite surface 4a of the sealing resin layer 4 and the upper end faces of the shield-layer metal pins 5c. An anticorrosion film may be provided on a surface of each of the shield-layer metal pins 5c. This can prevent the shield characteristics from being deteriorated by oxidation of the shield-layer metal pins 5c. For example, the anticorrosion film can be made of a metal such as SUS. In this case, the anticorrosion film is preferably formed when a close contact film and a protective film of the shield film 6 are formed.

According to this structure, since it is only necessary that the shield film 6 should cover the opposite surface 4a of the sealing resin layer 4 whose thickness is easily increased, the film deposition time of the shield film 6 can be shortened. When a top surface shield is not so important, the shield film 6 can be omitted. Since the film deposition process, such as sputtering, is unnecessary in this case, the production cost of the high-frequency module 1m can be reduced.

Thirteenth Embodiment

Figure 25:
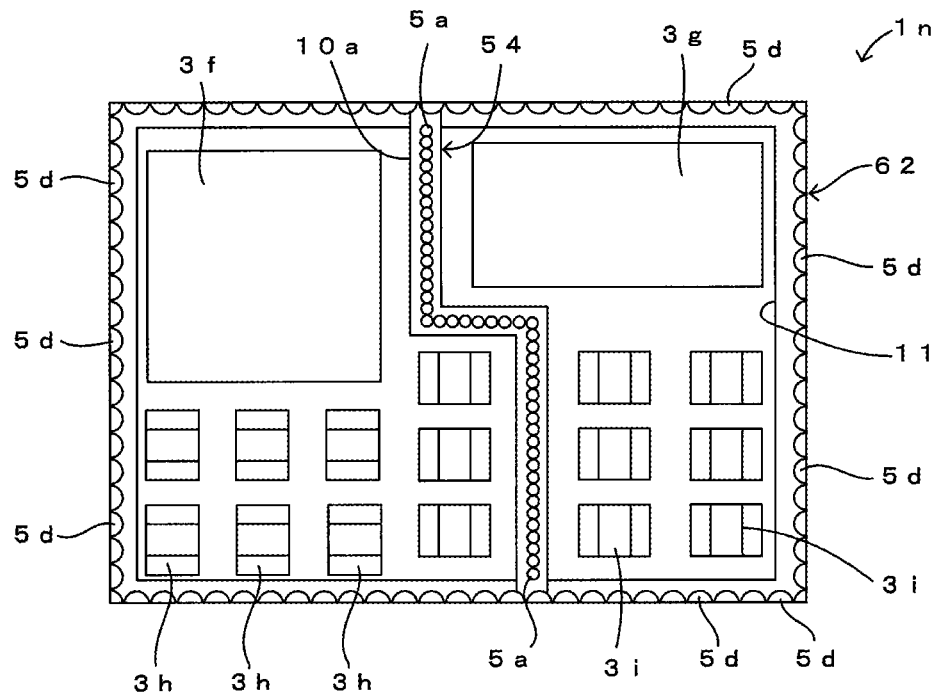
FIG. 25 is a plan view of a high-frequency module according to a thirteenth embodiment of the present disclosure.
Figure 26:
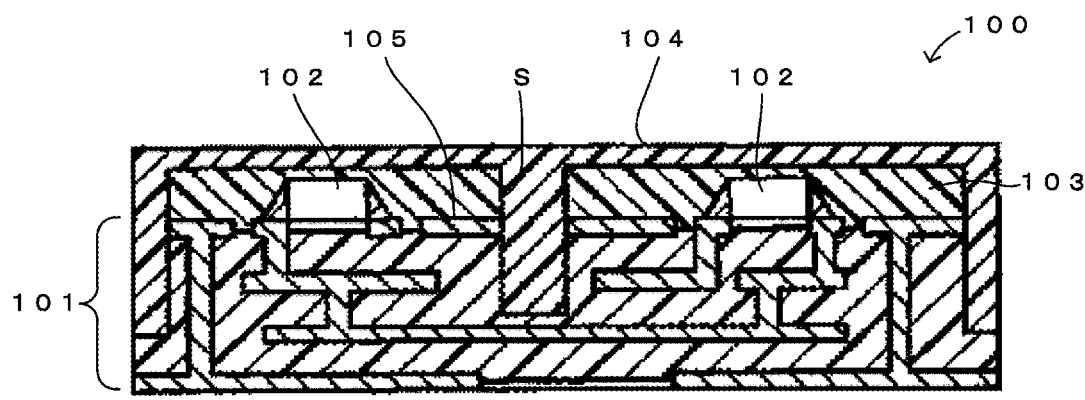
FIG. 26 is a cross-sectional view of a conventional high-frequency module.

A high-frequency module 1n according to a thirteenth embodiment of the present disclosure will be described with reference to FIG. 25. FIG. 25 is a plan view of the high-frequency module 1n and corresponds to FIG. 1.

The high-frequency module 1n according to this embodiment is different from the high-frequency module 1m of the twelfth embodiment described with reference to FIG. 24 in the shape of transverse sections of shield-layer metal pins 5d that constitute a shield layer 62, as illustrated in FIG. 25. Since other structures are the same as those of the high-frequency module 1m of the twelfth embodiment, they are denoted by the same signs and descriptions thereof are thereby skipped.

In this case, sections (transverse sections) of the shield-layer metal pins 5d along a direction parallel to an upper surface 2a of a wiring board 2 are each shaped like a semicircle having a linear portion and a curved portion. The shield-layer metal pins 5d are each arranged so that the linear portion overlaps with a part of a peripheral edge of the upper surface 2a of the wiring board 2 in a plan view of the wiring board 2.

Such a shape of the transverse section of the shield-layer metal pins 5d can be formed by, for example, a production method for obtaining multiple high-frequency modules 1n. Specifically, high-frequency modules 1n are produced in a state in which a plurality of wiring boards 2 are arranged in a matrix to form an assembly of the wiring boards 2, and are finally singulated into discrete high-frequency modules 1n by a dicing machine. At this time, a plurality of shield-layer metal pins 5d having a circular transverse section are arranged to cross boundary lines between the adjacent high-frequency modules 1n. Then, each of the shield-layer metal pins 5d are divided in two by cutting with the dicing machine, the transverse section is made semicircular, and the linear portion overlaps with a part of the peripheral edge of the upper surface 2a of the wiring board 2.

In this embodiment, the sectional shape of the shield-layer metal pins 5d (sectional shape along the direction parallel to the wiring board 2) may be rectangular. In this case, it is possible to reduce the fear that gaps are formed between the metal pins by displacement during cutting with the dicing machine. When the metal pins are mounted on the discrete modules without performing cutting with the dicing machine, the occurrence of gaps between the pins can be suppressed by using metal pins having a rectangular sectional shape.

According to this structure, it is possible to efficiently produce the high-frequency module 1 in which the side surface shield is constituted of a plurality of shield-layer metal pins 5d.

The present disclosure is not limited to the above-described embodiments, and various changes other the above can be made without departing from the purport of the disclosure. For example, the structures of the embodiments and modifications described above may be combined.

While the shield walls 5, 50, and 51 each have the bent portions in a plan view in the above-described first to third embodiments, they may have curved portions gently curved in a plan view, instead of the bent portions.

The present disclosure can be applied to various high-frequency modules each including a sealing resin layer that covers components mounted on a wiring board, a shield wall that prevents mutual interference of the noise between the components, and a shield layer that blocks unnecessary external noise.

1a to 1k, 1m, 1n high-frequency module
2 wiring board
3a to 3i component
4 sealing resin layer
5, 50 to 58 shield wall
5a metal pin
5a1 first metal pin
5a2 second metal pin
5c, 5d shield-layer metal pin
6 shield film (shield layer)
7 land electrode
10, 10a to 10e shield electrode (land electrode)
60 to 62 shield layer

The invention claimed is:

1. A high-frequency module comprising:
a wiring board;
a plurality of components mounted on a principal surface of the wiring board;
a sealing resin layer stacked on the principal surface of the wiring board to seal the plurality of components; and
a shield wall disposed between one or more predetermined components and another one or more components among the plurality of components inside the sealing resin layer,
wherein the shield wall has at least one metal pin standing on the principal surface of the wiring board,
an upper end of the at least one metal pin is exposed from an opposite surface of the sealing resin layer to a surface of the sealing resin layer facing the principal surface of the wiring board,
wherein the shield wall has a metal film filling a groove provided in the sealing resin layer, and a side surface of the metal film is in contact with a side surface of the at least one metal pin, the side surface of the at least one metal pin is connected to the upper end and a lower end of the at least one metal pin, a height of the metal pin is higher than a height of each of said plurality of components.

2. The high-frequency module according to claim 1, wherein the shield wall is line-shaped in a plan view of the wiring board, and the line has a bent portion, and wherein the least one metal pin is disposed in the bent portion.

3. The high-frequency module according to claim 2, wherein the shield wall includes a first linear portion having a first width and a second linear portion having a second width different from the first width in a plan view of the wiring board, and wherein a contact point between the first linear portion and the second linear portion is the bent portion.

4. The high-frequency module according to claim 2, wherein one end of the least one metal pin is coupled to a land electrode provided on the principal surface of the wiring board, and wherein the land electrode is coupled to a ground electrode provided in the wiring board.

5. The high-frequency module according to claim 1, wherein one end of the least one metal pin is coupled to a land electrode provided on the principal surface of the wiring board, and wherein the land electrode is coupled to a ground electrode provided in the wiring board.

6. The high-frequency module according to claim 1, wherein a purity of a metal in the metal film is lower than a purity of a metal in the least one metal pin.

7. The high-frequency module according to claim 6, wherein the sealing resin layer is disposed between the metal film and the wiring board.

8. The high-frequency module according to claim 1, wherein the sealing resin layer is disposed between the metal film and the wiring board.

9. The high-frequency module according to claim 1, wherein the least one metal pin of the shield wall includes a plurality of metal pins, and the shield wall is line-shaped in a plan view of the wiring board, and wherein the plurality of metal pins are arranged along the line defined by the shield wall in a plan view of the wiring board.

10. The high-frequency module according to claim 9, wherein the plurality of metal pins include a plurality of first metal pins and a plurality of second metal pins, wherein a connecting line connecting center points of the plurality of first metal pins is substantially parallel to the line defined by the shield wall in a plan view of the wiring board, and wherein centers of the plurality of second metal pins are not aligned with the connecting line and are each disposed between one of the first metal pins and an adjacent one of the first metal pins in a plan view of the wiring board.

11. The high-frequency module according to claim 10, wherein a cross-sectional area of the second metal pins along a direction parallel to the principal surface of the wiring board is smaller than a cross-sectional area of the first metal pins along the direction parallel to the principal surface of the wiring board.

12. The high-frequency module according to claim 10, wherein the line of the shield wall defined in a plan view of the wiring board has a bent portion or a curved portion.

13. The high-frequency module according to claim 9, wherein the line of the shield wall defined in a plan view of the wiring board has a bent portion or a curved portion.

14. A high-frequency module comprising:
a wiring board;
a component mounted on a principal surface of the wiring board;
a sealing resin layer stacked on the principal surface of the wiring board to seal the component; and
a shield layer covering at least a part of a surface of the sealing resin layer,
wherein the shield layer has a plurality of metal pins arranged on a side surface of the sealing resin layer,
an upper end of each of the plurality of metal pins is exposed from an opposite surface of the sealing resin layer to a surface of the sealing resin layer facing the principal surface of the wiring board,
wherein the shield wall has a metal film filling a groove provided in the sealing resin layer, and a side surface of the metal film is in contact with a side surface of the at least one metal pin, the side surface of the at least one metal pin is connected to the upper end and a lower end of the at least one metal pin,
a height of the metal pin is higher than a height of each of said plurality of components.

15. The high-frequency module according to claim 14, wherein surfaces of the metal pins each have an anticorrosion film.

16. The high-frequency module according to claim 14, wherein the plurality of metal pins are arranged along a peripheral edge of the principal surface of the wiring board to surround the principal surface.

17. The high-frequency module according to claim 16, wherein the principal surface of the wiring board is rectangular, wherein the plurality of metal pins have respective linear portions in cross sections along a direction parallel to the principal surface of the wiring board, and wherein the linear portions in the plurality of metal pins are disposed to overlap with a part of a peripheral edge of the principal surface of the wiring board in a plan view of the wiring board.

* * * * *

UNITED STATES PATENT AND TRADEMARK OFFICE
CERTIFICATE OF CORRECTION

PATENT NO. : 10,772,244 B2
APPLICATION NO. : 15/809236
DATED : September 8, 2020
INVENTOR(S) : Yoshihito Otsubo It is certified that error appears in the above-identified patent and that said Letters Patent is hereby corrected as shown below:

In the Specification

Column 10, Line 57, "module if" should read -- module 1f --

Column 10, Line 60, "module if" should read -- module 1f --

Column 10, Line 62, "module if" should read -- module 1f --

Column 12, Line 5, "module if" should read -- module 1f --

Column 13, Line 2, "module if" should read -- module 1f --

Column 13, Line 6, "module if" should read -- module 1f --

Column 13, Line 22, "module if" should read -- module 1f --

Column 13, Line 26, "module if" should read -- module 1f --

Column 13, Line 46, "module if" should read -- module 1f --

Column 13, Line 51, "module if" should read -- module 1f --

Column 13, Line 65, "module if" should read -- module 1f --

Column 14, Line 24, "module if" should read -- module 1f --

Column 14, Line 29, "module if" should read -- module 1f --

Column 15, Line 3, "module if" should read -- module 1f --

Signed and Sealed this
Twenty-first Day of November, 2023

Katherine Kelly Vidal
*Director of the United States Patent and Trademark Office*